United States Patent
Shimizu et al.

(10) Patent No.: US 9,812,589 B2
(45) Date of Patent: Nov. 7, 2017

(54) SEMICONDUCTOR DEVICE WITH SCHOTTKY BARRIER DIODE

(71) Applicant: Kabushiki Kaisha Toshiba, Minato-ku (JP)

(72) Inventors: Tatsuo Shimizu, Shinagawa (JP); Takashi Shinohe, Yokosuka (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/252,449

(22) Filed: Aug. 31, 2016

(65) Prior Publication Data

US 2017/0077317 A1 Mar. 16, 2017

(30) Foreign Application Priority Data

Sep. 11, 2015 (JP) ................................. 2015-179035

(51) Int. Cl.
*H01L 29/15* (2006.01)
*H01L 31/0312* (2006.01)
*H01L 29/872* (2006.01)
*H01L 29/16* (2006.01)
*H01L 21/04* (2006.01)
(Continued)

(52) U.S. Cl.
CPC ........ *H01L 29/872* (2013.01); *H01L 21/0495* (2013.01); *H01L 29/0619* (2013.01); *H01L 29/1608* (2013.01); *H01L 29/47* (2013.01); *H01L 29/8725* (2013.01); *H01L 29/045* (2013.01)

(58) Field of Classification Search
CPC . H01L 21/0485; H01L 21/0495; H01L 29/47; H01L 29/45; H01L 29/66068; H01L 29/6606; H01L 29/872; H01L 29/1608
See application file for complete search history.

(56) References Cited

U.S. PATENT DOCUMENTS 5,929,523 A * 7/1999 Parsons ............... H01L 21/0485
257/750
8,299,507 B2 10/2012 Shimizu et al.
(Continued)

FOREIGN PATENT DOCUMENTS

JP 2010-212361 A 9/2010
JP 5738376 B2 6/2015
(Continued)

OTHER PUBLICATIONS

U.S. Appl. No. 15/252,432, filed Aug. 31, 2016, Tatsuo Shimizu, et al.
(Continued)

*Primary Examiner* — Thanh Y Tran
(74) *Attorney, Agent, or Firm* — Oblon, McClelland, Maier & Neustadt, L.L.P.

(57) ABSTRACT

A semiconductor device according to an embodiment includes a first metal layer, a second metal layer, an n-type first SiC region provided between the first metal layer and the second metal layer and having an n-type impurity concentration of $1\times10^{18}$ cm$^{-3}$ or less, and a conductive layer provided between the first SiC region and the first metal layer and containing titanium (Ti), oxygen (O), and at least one element selected from the group consisting of vanadium (V), niobium (Nb), and tantalum (Ta).

14 Claims, 9 Drawing Sheets

(51) Int. Cl.
*H01L 29/47* (2006.01)
*H01L 29/06* (2006.01)
*H01L 29/04* (2006.01)

(56) References Cited

U.S. PATENT DOCUMENTS

| | | | |
|---|---|---|---|
| 2003/0013319 A1* | 1/2003 | Holmes | H01L 21/8221 438/761 |
| 2006/0094239 A1* | 5/2006 | Wurm | H01L 21/28562 438/680 |
| 2011/0177648 A1* | 7/2011 | Tanner | H01L 21/67236 438/72 |
| 2017/0077239 A1 | 3/2017 | Shimizu et al. | |
| 2017/0077288 A1 | 3/2017 | Shimizu et al. | |

FOREIGN PATENT DOCUMENTS

| | | |
|---|---|---|
| JP | 2017-55000 A | 3/2017 |
| JP | 2017-55002 A | 3/2017 |

OTHER PUBLICATIONS

U.S. Appl. No. 15/252,480, filed Aug. 31, 2016, Tatsuo Shimizu, et al.

S. Tanimoto, et al., "Toward a better understanding of $Ni_2Si$-based contact on SiC", Technical Program, ECSCRM2010, 2010, p. 152.

* cited by examiner

SEMICONDUCTOR DEVICE WITH SCHOTTKY BARRIER DIODE

CROSS-REFERENCE TO RELATED APPLICATION

This application is based upon and claims the benefit of priority from Japanese Patent Application No. 2015-179035, filed on Sep. 11, 2015, the entire contents of which are incorporated herein by reference.

FIELD

Embodiments described herein relate generally to a semiconductor device.

BACKGROUND

SiC (silicon carbide) is expected as a material for a next-generation semiconductor device. SiC has such excellent physical properties that the bandgap is three times that of Si (silicon), the breakdown field strength is about ten times that of Si, and the thermal conductivity is about three times that of Si. By using this characteristic, a semiconductor device having low loss and capable of being operated at a high temperature can be realized.

In a Schottky barrier diode using SiC, it is desired to realize a low forward voltage (on-voltage) stably.

DETAILED DESCRIPTION

A semiconductor device according to an embodiment includes a first metal layer, a second metal layer, an n-type first SiC region provided between the first metal layer and the second metal layer, the n-type first SiC region having an n-type impurity concentration of $1\times10^{18}$ cm$^{-3}$ or less, and a conductive layer provided between the first SiC region and the first metal layer, the conductive layer including titanium (Ti), oxygen (O), and at least one element from vanadium (V), niobium (Nb), and tantalum (Ta).

Hereinafter, embodiments of the present disclosure will be described with reference to the drawings. In the following description, the same sign will be given to the same or a similar member or the like, and description of a member or the like described once will be omitted appropriately.

In the following description, each of n$^+$, n, n$^-$, p$^+$, p, and p$^-$ indicates a relative magnitude of an impurity concentration in each conductive type. That is, it is indicated that n$^+$ has a relatively higher n-type impurity concentration than n and that n$^-$ has a relatively lower n-type impurity concentration than n. It is indicated that p$^+$ has a relatively higher p-type impurity concentration than p and that p$^-$ has a relatively lower p-type impurity concentration than p. An n$^+$ type or an n$^-$ type may be referred to simply as an n type. A p$^+$ type or a p$^-$ type may be referred to simply as a p type.

First Embodiment

A semiconductor device according to the present embodiment includes a first metal layer, a second metal layer, an n-type first SiC region provided between the first metal layer and the second metal layer, the n-type first SiC region having an n-type impurity concentration of $1\times10^{18}$ cm$^{-3}$ or less, and a conductive layer provided between the first SiC region and the first metal layer. The conductive layer including titanium (Ti), oxygen (O), and at least one element from vanadium (V), niobium (Nb), and tantalum (Ta).

Figure 1:
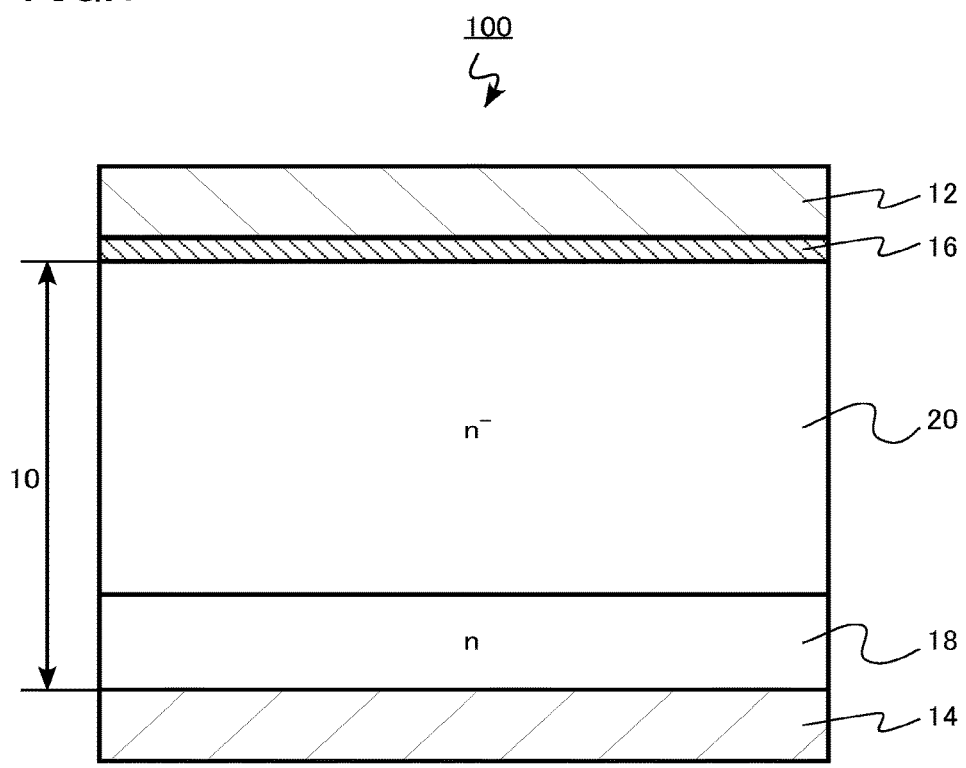
FIG. 1 is a schematic cross sectional view of a semiconductor device according to a first embodiment.

FIG. 1 is a schematic cross sectional view illustrating a structure of a Schottky barrier diode (hereinafter, also referred to as SBD) which is a semiconductor device according to the present embodiment.

An SBD 100 includes an SiC layer 10, an anode (first metal layer) 12, a cathode (second metal layer) 14, and a conductive layer 16. The SiC layer 10 includes a cathode region (n-type second SiC region) 18 and a drift region (n-type first SiC region) 20.

The SiC layer 10 is formed of SiC having a crystal structure of 4H—SiC. 4H—SiC is a hexagonal crystal system.

The SiC layer 10 includes a first plane and a second plane. In FIG. 1, the first plane is the upper plane, and the second plane is the lower plane. The first plane is referred to as a front plane, and the second plane is referred to as a back plane.

A case in which the first plane is inclined by 0 degree or more and 8 degrees or less with respect to the (0001) face and the second plane is inclined by 0 degree or more and 8 degrees or less with respect to the (000-1) face will be exemplified. The (0001) face is referred to as a silicon face. The (000-1) face is referred to as a carbon face.

The cathode region 18 is formed of n-type SiC. For example, the cathode region 18 contains nitrogen (N) as n-type impurities. The n-type impurity concentration in the cathode region 18 is $1\times10^{18}$ cm$^{-3}$ or more and $1\times10^{21}$ cm$^{-3}$ or less. The n-type impurity concentration in the cathode region 18 is higher than that in the drift region 20.

The n-type impurity concentration on the second plane of the cathode region 18 is preferably $1\times10^{19}$ cm$^{-3}$ or more, and more preferably $1\times10^{20}$ cm$^{-3}$ or more from a viewpoint of reducing a contact resistance between the cathode 14 and the cathode region 18.

The drift region 20 is provided on the cathode region 18. For example, the drift region 20 is formed of n$^-$-type SiC formed on the cathode region 18 by epitaxial growth. The drift region 20 has a thickness, for example, of 5 μm or more and 150 μm or less.

For example, the drift region 20 contains nitrogen (N) as n-type impurities. For example, the n-type impurity concentration in the drift region 20 is $5\times10^{15}$ cm$^{-3}$ or more and $1\times10^{18}$ cm$^{-3}$ or less. The n-type impurity concentration in the drift region 20 is preferably $1\times10^{18}$ cm$^{-8}$ or less from a viewpoint of improving a breakdown voltage of the SBD.

The anode 12 is provided on the front plane of the SiC layer 10. The anode 12 is formed of metal. For example, a metal to form the anode 12 has a structure in which titanium (Ti) and aluminum (Al) are stacked.

The cathode 14 is provided on the back plane of the SiC layer 10. The cathode 14 is connected to the cathode region 18 electrically.

The cathode 14 is formed of metal. For example, a metal to form the cathode 14 is nickel (Ni). The metal to form the cathode 14 may react with the SiC layer 10 to form a metal silicide or a metal carbide.

The conductive layer 16 is provided between the drift region 20 and the anode 12. The conductive layer 16 is in contact with the drift region 20. The conductive layer 16 is in contact with the anode 12.

The conductive layer 16 contains titanium (Ti) and oxygen (O). The conductive layer 16 contains at least one element selected from the group consisting of vanadium (V), niobium (Nb), and tantalum (Ta).

The conductive layer 16 is formed of a metal oxide. The conductive layer 16 is formed, for example, of titanium oxide. The conductive layer 16 is polycrystalline or amorphous.

The conductive layer 16 has a thickness, for example, of 10 nm or more and 100 nm or less.

A metal oxide exhibits conductivity because an element is added thereto. For example, by adding vanadium (V), niobium (Nb), or tantalum (Ta) serving as n-type impurities to a metal oxide by substitution for titanium (Ti), the metal oxide exhibits n-type conductivity with an electron serving as a carrier.

For example, the concentration of an element in the conductive layer 16 is $1 \times 10^{18}$ cm$^{-3}$ or more and $1 \times 10^{21}$ cm$^{-3}$ or less. The concentration of an element in the conductive layer 16 is preferably $1 \times 10^{19}$ cm$^{-3}$ or more and $1 \times 10^{20}$ cm$^{-3}$ or less from a viewpoint of reducing electric resistance of the conductive layer 16.

Nitrogen (N) may be added to the conductive layer 16 from a viewpoint of increasing a barrier height between the drift region 20 and the conductive layer 16. Zirconium (Zr) or hafnium (Hf) may be added to the conductive layer 16 from a viewpoint of reducing the barrier height between the drift region 20 and the conductive layer 16.

The kind, the amount, and the atomic ratio of an element contained in the conductive layer 16 can be identified by secondary ion mass spectrometry (SIMS).

For example, the conductive layer 16 can be formed by a sputtering method at 400° C. or lower. The conductive layer 16 is amorphous in this state. Thereafter, the conductive layer 16 may be subjected to crystallization by annealing (600° C. to 800° C.). A polycrystalline film may be formed by growing a film with excellent coverage by a CVD method and subjecting the film to crystallization by annealing. At this time, the film can be formed into a columnar shape in a film thickness direction. When the film is formed into a stacked structure having two or more polycrystalline film layers with different column sizes, uniformity of an electrical characteristic of the film in the film plane is increased. The stacked structure with different column sizes is realized by performing film-formation a plurality of times, for example, performing film-formation, crystallization, film-formation (at a different temperature), and crystallization. This point is similar in the following embodiments.

Hereinafter, functions and effects of the semiconductor device according to the present embodiment will be described.

Figure 2:
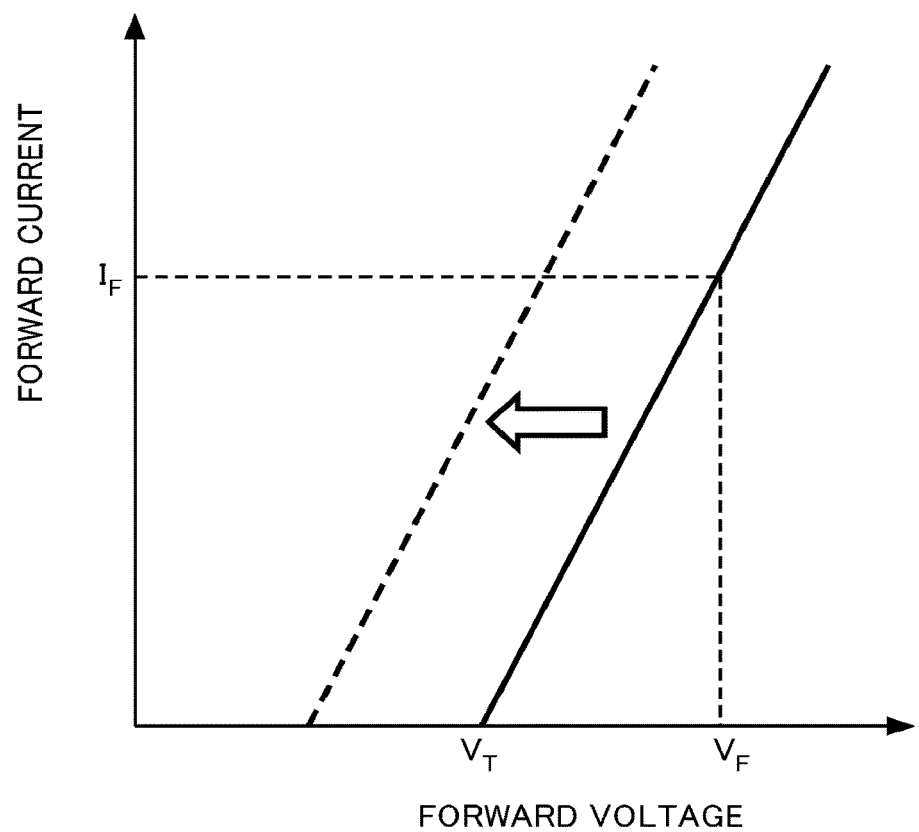
FIG. 2 illustrates functions and effects of the semiconductor device according to the first embodiment.

FIG. 2 illustrates functions and effects of the SBD according to the present embodiment. FIG. 2 illustrates a characteristic of the SBD in a forward direction. Hereinafter, a voltage value at a predetermined current value ($I_F$) will be referred to as a forward voltage (on-voltage: $V_F$). A voltage value when a current starts to flow in a forward direction is referred to as a rising voltage (threshold voltage: $V_T$).

The SBD desirably has a low forward voltage (on-voltage). In FIG. 2, a voltage-current characteristic is desirably shifted in the arrow direction. For example, by lowering the forward voltage, operation is possible at a high frequency. In addition, high-speed switching is possible.

The rising voltage ($V_T$) of the SBD depends on a barrier height ($\phi B$) between the drift region of SiC and the anode. In other words, the rising voltage ($V_T$) depends on a barrier height ($\phi B$) of Schottky junction between the drift region of SiC and the anode. In order to lower the forward voltage, the rising voltage ($V_T$) may be lowered.

The barrier height ($\phi B$) is a difference between work function of the anode and electron affinity of SiC. Therefore, in order to lower the rising voltage ($V_T$), it is necessary to lower the difference between the work function of the anode and the electron affinity of SiC.

The work function is an energy difference between a vacuum level (energy level of vacuum) and a Fermi level of a target substance. The electron affinity is a difference between the vacuum level (energy level of vacuum) and an energy level of a target substance at a lower end of a conductive band.

When titanium (Ti), nickel (Ni), molybdenum (Mo), tungsten (W), or the like is used as a metal to form the anode, the work function is more than 4.30 eV. 4H—SiC has electron affinity of 3.60 eV. Therefore, the barrier height is more than 0.70 eV.

For example, silicon (Si) has electron affinity of 4.05 eV, larger than 4H—SiC. Therefore, when the same metal is applied to the anode, the barrier height of silicon can be lower than that of 4H—SiC.

In addition, when the above described metal is used for the anode, the barrier height between the metal and SiC may be lowered by performing a heat treatment. In this case, even when the barrier height is lowered, variation in the barrier height may be increased, and the forward voltage of the SBD may not be stable disadvantageously.

Figure 3:
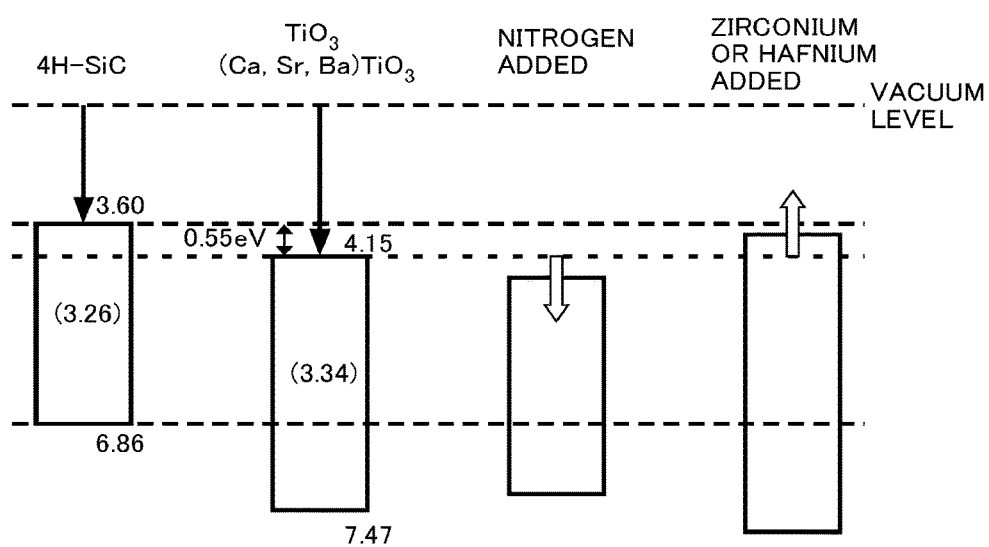
FIG. 3 illustrates functions and effects of the semiconductor device according to the first embodiment.
Figure 4:
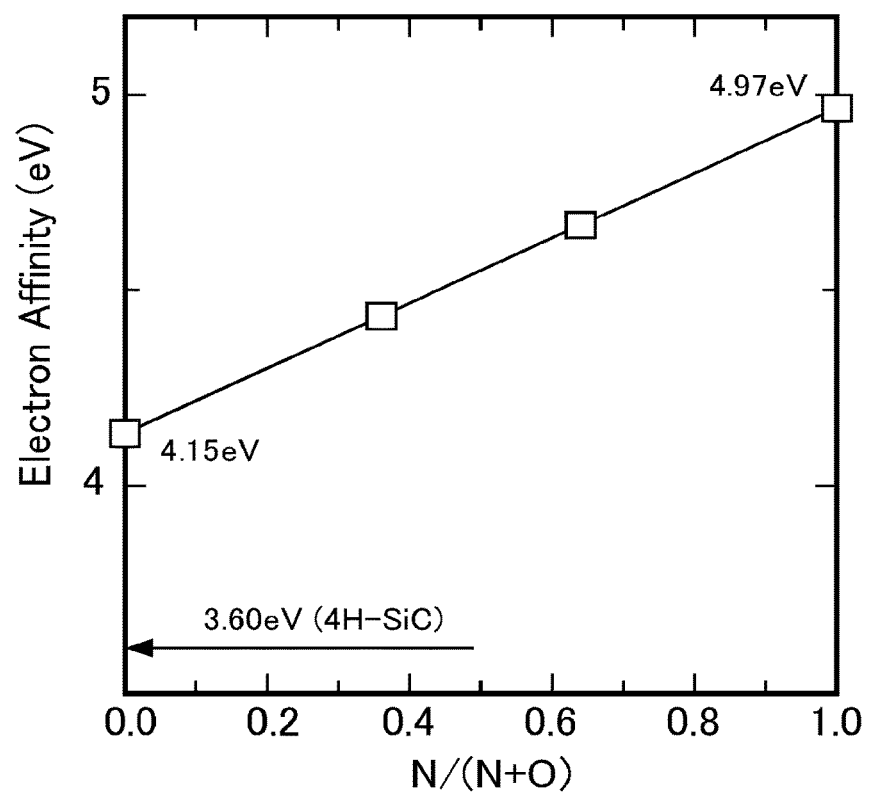
FIG. 4 illustrates functions and effects of the semiconductor device according to the first embodiment.
Figure 5:
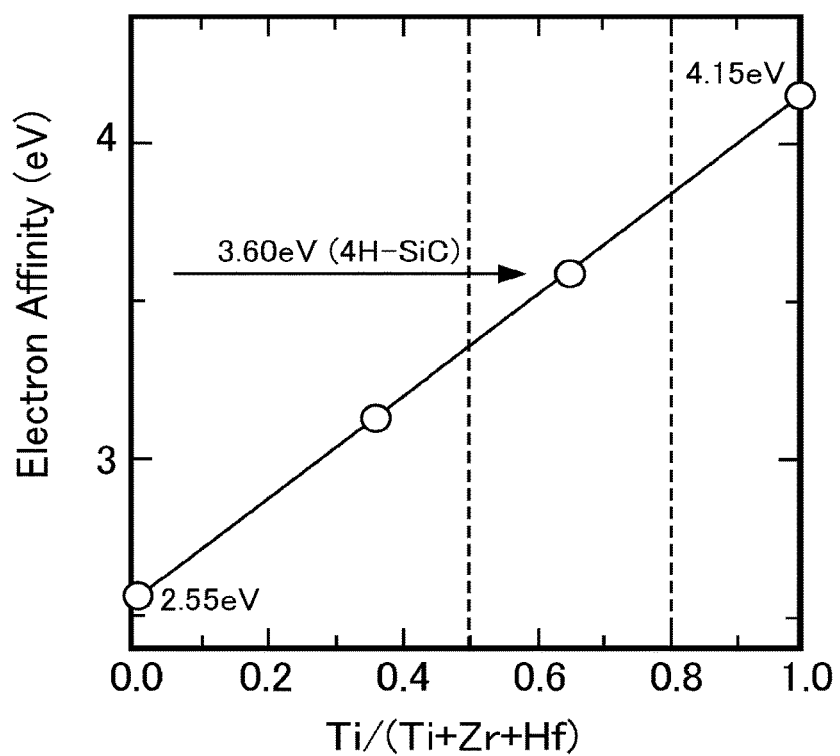
FIG. 5 illustrates functions and effects of the semiconductor device according to the first embodiment.

FIGS. 3 to 5 illustrate functions and effects of the SBD according to the present embodiment.

FIG. 3 illustrates an energy band structure of each of 4H—SiC, titanium oxide ($TiO_2$), calcium titanate ($CaTiO_3$), strontium titanate ($SrTiO_3$), and barium titanate ($BaTiO_3$). FIG. 3 illustrates an energy difference between the vacuum level and a lower end of a conductive band (electron affinity), an energy difference between the vacuum level and an upper end of a valence band, and a bandgap energy in each material. In FIG. 3, a numerical value in parentheses indicates a bandgap energy. FIG. 3 also illustrates a band structure in which nitrogen (N), zirconium (Zr), or hafnium (Hf) is added to titanium oxide, calcium titanate, strontium titanate, or barium titanate.

FIG. 4 illustrates change in the electron affinity of titanium oxide when nitrogen (N) is added to titanium oxide. The electron affinity is calculated using first principle calculation. When n-type impurities are introduced into a metal oxide such as titanium oxide for metallization, it is assumed that the Fermi level of titanium oxide is the same as the energy level at the lower end of the conductive band. Therefore, it can be assumed that the work function of the metal oxide is the same as the electron affinity.

As illustrated in FIG. 4, as a result of the first principle calculation by the inventors, it has been clarified that the electron affinity is increased by adding nitrogen (N) to titanium oxide. When nitrogen (N) is not added, that is, in a case of titanium oxide, the electron affinity is 4.15 eV. On the other hand, nitrogen (N) atoms are substituted for all the oxygen (O) atoms of titanium oxide, that is, in a case of titanium nitride ($Ti_3N_4$), the electron affinity is 4.97 eV.

FIG. 5 illustrates change in the electron affinity of titanium oxide when zirconium (Zr) or hafnium (Hf) is added to titanium oxide. The electron affinity is calculated using the first principle calculation.

As illustrated in FIG. 5, as a result of the first principle calculation by the inventors, it has been clarified that the electron affinity is reduced by adding zirconium (Zr) or hafnium (Hf) to titanium oxide. When zirconium (Zr) or hafnium (Hf) is not added, that is, in a case of titanium oxide, the electron affinity is 4.15 eV. On the other hand, zirconium (Zr) atoms or hafnium (Hf) atoms are substituted for all the titanium (Ti) atoms of titanium oxide, that is, in a case of zirconium oxide or hafnium oxide, the electron affinity is reduced to 2.55 eV.

In the SBD 100 according to the present embodiment, the conductive layer 16 is provided between the drift region 20 and the anode 12. The conductive layer 16 is formed of a metal oxide containing metallized titanium. As illustrated in FIG. 3, the work function of the metal oxide containing titanium is 4.15 eV. 4H—SiC has electron affinity of 3.60 eV. Therefore, the barrier height is 0.55 eV, and Schottky junction having a low barrier height is realized. Therefore, the SBD 100 having a low rising voltage ($V_T$) and a low forward voltage is realized.

For example, the conductive layer 16 can be formed at a low temperature of 400° C. or lower. A heat treatment at a high temperature is not necessarily required for forming the conductive layer 16, and there is no possibility of variation in the barrier height caused by the heat treatment.

Furthermore, by adding nitrogen (N) to the conductive layer 16, the work function of the conductive layer 16 can be increased, and the barrier height can be higher than 0.55 eV. Therefore, when a high forward voltage is requested, the forward voltage can be adjusted by adding nitrogen (N) to the conductive layer 16.

Furthermore, by adding zirconium (Zr) or hafnium (Hf) to the conductive layer 16, the work function of the conductive layer 16 can be reduced, and the barrier height can be lower than 0.55 eV. Therefore, when a low forward voltage is requested, the forward voltage can be adjusted by adding zirconium (Zr) or hafnium (Hf) to the conductive layer 16.

Contact between the conductive layer 16 and the anode 12 is contact between metals, and therefore a low contact resistance is realized regardless of the work function of a metal material of the anode 12. The conductive layer 16 is in contact with the anode 12 by ohmic contact. The contact between the conductive layer 16 and the anode 12 is contact between metals, and therefore a range of selection of a metal material to form the anode 12 is widened.

As described above, according to the present embodiment, the SBD 100 having a low and stable forward voltage is realized.

Second Embodiment

A semiconductor device according to the present embodiment includes a first metal layer, a second metal layer, an n-type first SiC region provided between the first metal layer and the second metal layer, the first SiC region having an n-type impurity concentration of $1\times10^{11}$ $cm^{-3}$ or less, and a conductive layer provided between the first SiC region and the first metal layer. The conductive layer including titanium (Ti), oxygen (O), at least one metal element from calcium (Ca), strontium (Sr), and barium (Ba), and at least one element from vanadium (V), niobium (Nb), tantalum (Ta), scandium (Sc), yttrium (Y), and lanthanoid The semiconductor device according to the present embodiment is similar to the first embodiment except that the conductive layer contains at least one metal element selected from the group consisting of calcium (Ca), strontium (Sr), and barium (Ba) and that an element which may be contained in the conductive layer is different. Therefore, description of contents overlapping with the first embodiment will be omitted.

The semiconductor device according to the present embodiment is an SBD. The SBD according to the present embodiment will be described with reference to FIG. 1.

A conductive layer 16 contains at least one metal element selected from the group consisting of calcium (Ca), strontium (Sr), and barium (Ba). The conductive layer 16 contains titanium (Ti) and oxygen (O). The conductive layer 16 contains at least one element selected from the group consisting of vanadium (V), niobium (Nb), tantalum (Ta), scandium (Sc), yttrium (Y), and lanthanoid.

The conductive layer 16 is formed of a metal oxide. For example, the conductive layer 16 is formed of calcium titanate, strontium titanate, barium titanate, or a complex thereof. For example, the conductive layer 16 is formed of $(Ca,Sr,Ba)TiO_3$ having a perovskite structure. The conductive layer 16 is polycrystalline or amorphous.

The conductive layer 16 has a thickness, for example, of 10 nm or more and 100 nm or less.

A metal oxide exhibits conductivity because an element is added thereto. For example, by adding vanadium (V), niobium (Nb), or tantalum (Ta) serving as n-type impurities to a metal oxide by substitution for titanium (Ti), the metal oxide exhibits n-type conductivity with an electron serving as a carrier. For example, by adding scandium (Sc), yttrium (Y), or lanthanoid serving as n-type impurities to a metal oxide by substitution for calcium (Ca), strontium (Sr), or barium (Ba), the metal oxide exhibits n-type conductivity with an electron serving as a carrier. Lanthanoid includes lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), and lutetium (Lu).

For example, the concentration of an element in the conductive layer 16 is $1\times10^{18}$ $cm^{-3}$ or more and $1\times10^{21}$ $cm^{-3}$ or less. The concentration of an element in the conductive layer 16 is preferably $1\times10^{19}$ $cm^{-3}$ or more, and more preferably $1\times10^{20}$ $cm^{-3}$ or more from a viewpoint of reducing electric resistance of the conductive layer 16.

Nitrogen (N) may be added to the conductive layer 16 from a viewpoint of increasing a barrier height between a drift region 20 and the conductive layer 16. Zirconium (Zr) or hafnium (Hf) may be added to the conductive layer 16 from a viewpoint of reducing the barrier height between the drift region 20 and the conductive layer 16.

The kind, the amount, and the atomic ratio of an element contained in the conductive layer 16 can be identified by secondary ion mass spectrometry (SIMS).

For example, the conductive layer 16 can be formed by a sputtering method at 400° C. or lower. The conductive layer 16 is amorphous in this state. Thereafter, the conductive layer 16 may be subjected to crystallization by annealing (600° C. to 800° C.). A polycrystalline film may be formed by growing a film with excellent coverage by a CVD method and subjecting the film to crystallization by annealing. At this time, the film can be formed into a columnar shape in a film thickness direction. When the film is formed into a stacked structure having two or more polycrystalline film layers with different column sizes, uniformity of an electrical characteristic of the film in the film plane is increased. Particularly for a PTCR effect, it is important to make a polycrystalline interface even, and it is effective to form a stacked structure having two or more polycrystalline film layers with different column sizes. This point is similar in the following embodiments.

Hereinafter, functions and effects of the semiconductor device according to the present embodiment will be described.

Figure 6:
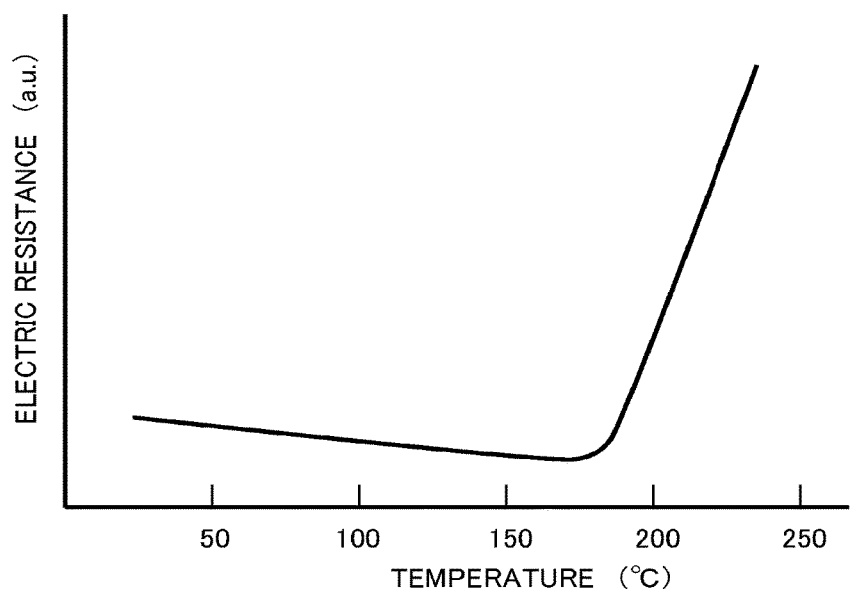
FIG. 6 illustrates functions and effects of a semiconductor device according to a second embodiment.

FIG. 6 illustrates functions and effects of the semiconductor device according to the present embodiment. FIG. 6 illustrates temperature dependency of electric resistance of the conductive layer 16 in the present embodiment.

For example, the conductive layer 16 in the present embodiment is formed of calcium titanate, strontium titanate, or barium titanate. As illustrated in FIG. 6, in calcium titanate, strontium titanate, barium titanate, or a complex thereof, the temperature dependency of electric resistance is changed from negative dependency to positive dependency. In other words, the conductive layer 16 in the present embodiment is a positive temperature coefficient resistor (PTCR) in a high temperature region.

For example, when an overcurrent flows in the SBD, the SBD may be broken by heat generated due to the overcurrent. In the SBD according to the present embodiment, the conductive layer 16 is a PTCR. Therefore, when an overcurrent flows and heat is generated, the electric resistance of the conductive layer 16 is increased. Therefore, the current flowing in the SBD is suppressed, and breakdown of the SBD due to the overcurrent is suppressed.

In a region of operation temperature of the SBD, the electric resistance of the conductive layer 16 preferably has no temperature dependency or has negative temperature dependency in order to prevent reduction in an on-current of the SBD. Before the SBD is broken by rise in temperature, the temperature dependency of the electric resistance of the conductive layer 16 is preferably changed to positive dependency. The temperature dependency of the electric resistance of the conductive layer 16 is preferably changed from negative dependency to positive dependency at a temperature of 150° C. or higher and 200° C. or lower.

The conductive layer 16 preferably contains lead (Pb). Calcium titanate, strontium titanate, barium titanate, or a complex thereof can shift a positive temperature coefficient region to a higher temperature side by containing lead (Pb).

As described above, according to the present embodiment, the SBD 100 having a low and stable forward voltage is realized as in the first embodiment. Furthermore, the conductive layer 16 which is a PTCR suppresses breakdown of the SBD by the overcurrent.

Third Embodiment

A semiconductor device according to the present embodiment is different from the first embodiment in that the semiconductor device is a junction barrier controlled Schottky (JBS) diode. Description of contents overlapping with the first embodiment in a structure of a conductive layer, functions, or the like will be omitted.

Figure 7:
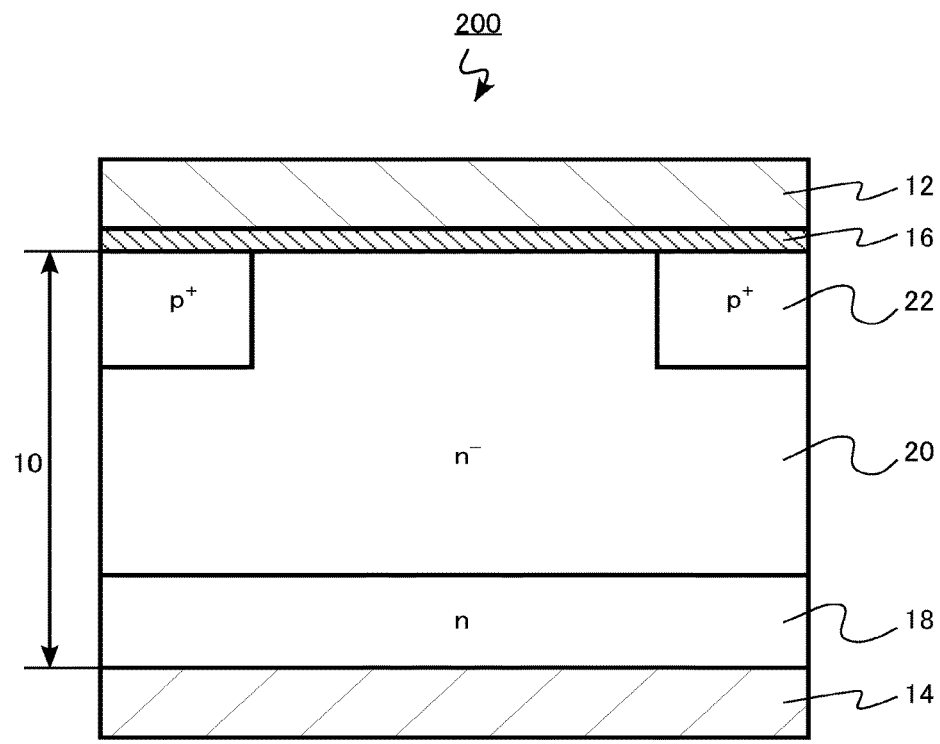
FIG. 7 is a schematic cross sectional view of a semiconductor device according to a third embodiment.

FIG. 7 is a schematic cross sectional view illustrating a structure of a JBS diode 200 which is the semiconductor device according to the present embodiment.

The JBS diode 200 includes an SiC layer 10, an anode (first metal layer) 12, a cathode (second metal layer) 14, and a conductive layer 16. The SiC layer 10 includes a cathode region (n-type second SiC region) 18, a drift region (n-type first SiC region) 20, and a p-type SiC region 22.

The p-type SiC region 22 is provided in the drift region 20. For example, the p-type SiC region 22 contains aluminum (Al) as p-type impurities. The p-type impurity concentration in the p-type SiC region 22 is $1 \times 10^{17}$ cm$^{-3}$ or more and $1 \times 10^{21}$ cm$^{-3}$ or less. The p-type SiC region 22 has a depth, for example, of 0.4 μm or more and 0.8 μm or less.

The conductive layer 16 contains titanium (Ti) and oxygen (O). The conductive layer 16 contains at least one element selected from the group consisting of vanadium (V), niobium (Nb), and tantalum (Ta).

The conductive layer 16 is formed of a metal oxide. The conductive layer 16 is formed, for example, of titanium oxide. The conductive layer 16 is polycrystalline or amorphous.

When a reverse bias is applied to the JBS diode 200, a depletion layer is elongated from an end of the p-type SiC region 22 to the drift region 20, and Schottky junction between the drift region 20 and the conductive layer 16 is covered with the depletion layer. Therefore, a leak current of the JBS diode 200 is reduced.

As described above, according to the present embodiment, the JBS diode 200 having a low and stable forward voltage is realized by similar functions to the first embodiment. Furthermore, a leak current is reduced when a reverse bias is applied.

Fourth Embodiment

A semiconductor device according to the present embodiment is similar to the third embodiment except that a conductive layer contains at least one metal element selected from the group consisting of calcium (Ca), strontium (Sr), and barium (Ba) and that an element which may be contained in the conductive layer is different. Therefore, description of contents overlapping with the third embodiment will be omitted. Description of contents overlapping with the first or second embodiment in a structure of the conductive layer, functions, or the like will be omitted.

The semiconductor device according to the present embodiment is a JBS diode. The JBS diode according to the present embodiment will be described with reference to FIG. 7.

A conductive layer 16 contains at least one metal element selected from the group consisting of calcium (Ca), strontium (Sr), and barium (Ba). The conductive layer 16 contains titanium (Ti) and oxygen (O). The conductive layer 16 contains at least one element selected from the group consisting of vanadium (V), niobium (Nb), tantalum (Ta), scandium (Sc), yttrium (Y), and lanthanoid.

The conductive layer 16 is formed of a metal oxide. For example, the conductive layer 16 is formed of calcium titanate, strontium titanate, barium titanate, or a complex thereof. For example, the conductive layer 16 is formed of $(Ca,Sr,Ba)TiO_3$ having a perovskite structure. The conductive layer 16 is polycrystalline or amorphous.

The conductive layer 16 is a PTCR. The conductive layer 16 preferably contains lead (Pb). Calcium titanate, strontium titanate, barium titanate, or a complex thereof can shift a positive temperature coefficient region to a higher temperature side by containing lead (Pb).

As described above, according to the present embodiment, the JBS diode having a low and stable forward voltage is realized by similar functions to the third embodiment. By similar functions to the third embodiment, a leak current is reduced when a reverse bias is applied. Furthermore, the conductive layer 16 which is a PTCR suppresses breakdown of the JBS diode by an overcurrent.

Fifth Embodiment

A semiconductor device according to the present embodiment is different from the first embodiment in that the semiconductor device is a merged PIN Schottky (MPS) diode. Description of contents overlapping with the first embodiment in a structure of a conductive layer, functions, or the like will be omitted.

Figure 8:
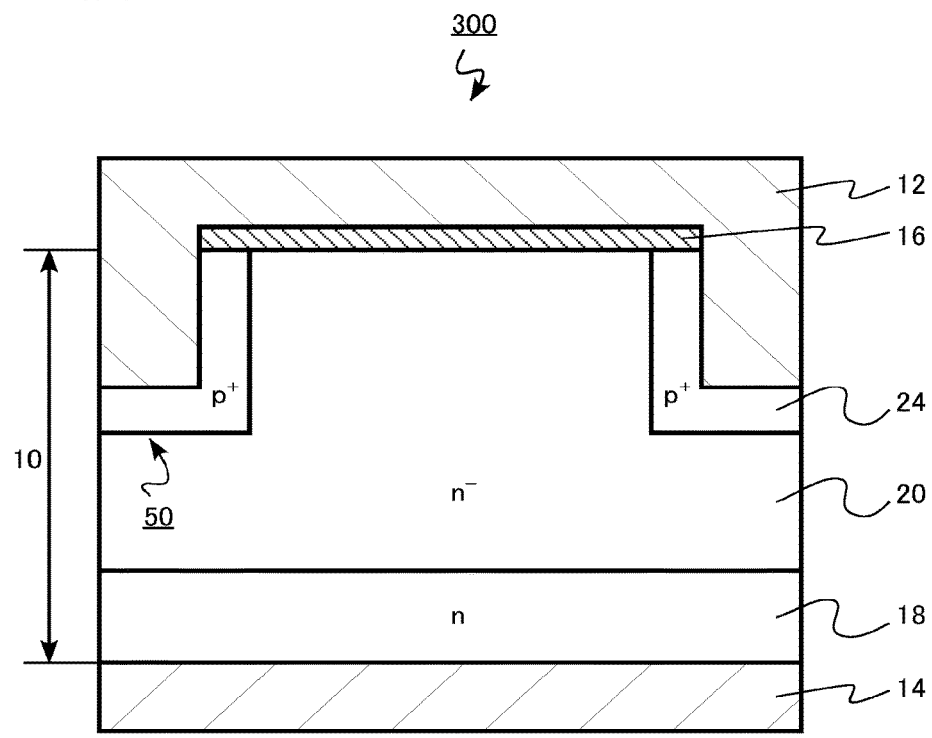
FIG. 8 is a schematic cross sectional view of a semiconductor device according to a fifth embodiment.

FIG. 8 is a schematic cross sectional view illustrating a structure of an MPS diode 300 which is the semiconductor device according to the present embodiment. The MPS diode 300 has a trench structure.

The MPS diode 300 includes an SiC layer 10, an anode (first metal layer) 12, a cathode (second metal layer) 14, and a conductive layer 16. The SiC layer 10 includes a cathode region (n-type second SiC region) 18, a drift region (n-type first SiC region) 20, and a p-type SiC region 24.

The p-type SiC region 24 is provided in the drift region 20. The p-type SiC region 24 is formed around a trench 50 formed in the SiC layer 10.

For example, the p-type SiC region 24 contains aluminum (Al) as p-type impurities. The p-type impurity concentration in the p-type SiC region 24 is $1 \times 10^{17}$ cm$^{-3}$ or more and $1 \times 10^{20}$ cm$^{-3}$ or less.

The conductive layer 16 contains titanium (Ti) and oxygen (O). The conductive layer 16 contains at least one element selected from the group consisting of vanadium (V), niobium (Nb), and tantalum (Ta).

The conductive layer 16 is formed of a metal oxide. The conductive layer 16 is formed, for example, of titanium oxide. The conductive layer 16 is polycrystalline or amorphous.

The anode 12 is provided on the front plane of the SiC layer 10 and in the trench 50. The anode 12 is formed of metal. For example, a metal to form the anode 12 has a structure in which titanium (Ti) and aluminum (Al) are stacked.

The anode 12 is in contact with the p-type SiC region 24 by ohmic contact.

When a reverse bias is applied to the MPS diode 300, a depletion layer is elongated from an end of the p-type SiC region 24 to the drift region 20, and Schottky junction between the drift region 20 and the conductive layer 16 is covered with the depletion layer. Therefore, a leak current of the MPS diode 300 is reduced.

When a forward surge current flows in the MPS diode 300, conductivity modulation occurs by injection of a hole from the p-type SiC region 24. Therefore, surge current resistance of the MPS diode 300 is improved.

As described above, according to the present embodiment, the MPS diode 300 having a low and stable forward voltage is realized by similar functions to the first embodiment. Furthermore, a leak current is reduced when a reverse bias is applied. Furthermore, the surge current resistance is improved.

Sixth Embodiment

A semiconductor device according to the present embodiment is similar to the fifth embodiment except that a conductive layer contains at least one metal element selected from the group consisting of calcium (Ca), strontium (Sr), and barium (Ba) and that an element which may be contained in the conductive layer is different. Therefore, description of contents overlapping with the fifth embodiment will be omitted. Description of contents overlapping with the first or second embodiment in a structure of the conductive layer, functions, or the like will be omitted.

The semiconductor device according to the present embodiment is an MPS diode. The MPS diode according to the present embodiment will be described with reference to FIG. 8.

A conductive layer 16 contains at least one metal element selected from the group consisting of calcium (Ca), strontium (Sr), and barium (Ba). The conductive layer 16 contains titanium (Ti) and oxygen (O). The conductive layer 16 contains at least one element selected from the group consisting of vanadium (V), niobium (Nb), tantalum (Ta), scandium (Sc), yttrium (Y), and lanthanoid.

The conductive layer 16 is formed of a metal oxide. For example, the conductive layer 16 is formed of calcium titanate, strontium titanate, barium titanate, or a complex thereof. For example, the conductive layer 16 is formed of (Ca,Sr,Ba)TiO$_3$ having a perovskite structure. The conductive layer 16 is polycrystalline or amorphous.

The conductive layer 16 is a PTCR. The conductive layer 16 preferably contains lead (Pb). Calcium titanate, strontium titanate, barium titanate, or a complex thereof can shift a positive temperature coefficient region to a higher temperature side by containing lead (Pb).

As described above, according to the present embodiment, the MPS diode having a low and stable forward voltage is realized by similar functions to the fifth embodiment. By similar functions to the fifth embodiment, a leak current is reduced when a reverse bias is applied. Furthermore, the conductive layer 16 which is a PTCR suppresses breakdown of the MPS diode by an overcurrent.

Seventh Embodiment

A semiconductor device according to the present embodiment is different from the first embodiment in that the semiconductor device is a double Schottky diode. Description of contents overlapping with the first embodiment in a structure of a conductive layer, functions, or the like will be omitted.

FIG. 8 is a schematic cross sectional view illustrating a structure of a double Schottky diode 400 which is the semiconductor device according to the present embodiment. The double Schottky diode 400 has a trench structure.

The double Schottky diode 400 includes an SiC layer 10, an anode (first metal layer) 12, a cathode (second metal layer) 14, a conductive layer 16, and a high barrier film 30. The SiC layer 10 includes a cathode region (n-type second SiC region) 18 and a drift region (n-type first SiC region) 20.

The conductive layer 16 contains titanium (Ti) and oxygen (O). The conductive layer 16 contains at least one element selected from the group consisting of vanadium (V), niobium (Nb), and tantalum (Ta).

The conductive layer 16 is formed of a metallized metal oxide. The conductive layer 16 is formed, for example, of titanium oxide. The conductive layer 16 is polycrystalline or amorphous.

The high barrier film 30 is provided in the trench 50. The high barrier film 30 has a higher work function than the conductive layer 16. The high barrier film 30 is formed, for example, of titanium oxide ($TiO_2$) containing ruthenium (Lu) Titanium oxide increases the work function by containing lutetium.

The Schottky barrier between the high barrier film 30 and the drift region 20 is higher than that between the conductive layer 16 and the drift region 20.

A metal having a higher work function than the conductive layer 16 can be applied to the high barrier film 30 in place of the metal oxide film.

The anode 12 is provided on the front plane of the SiC layer 10 and in the trench 50. The anode 12 is formed of metal. For example, a metal to form the anode 12 has a structure in which titanium (Ti) and aluminum (Al) are stacked.

When a reverse bias is applied to the double Schottky diode 400, a depletion layer is elongated from an end of the high barrier film 30 to the drift region 20, and Schottky junction between the drift region 20 and the conductive layer 16 is covered with the depletion layer. Particularly, because the high barrier film 30 is a metallized metal oxide film, the elongation amount of the depletion layer is more than the case in which a p-type SiC layer is used in place of the high barrier film 30. Therefore, the double Schottky diode 400 can reduce a leak current without reducing an on-current excessively.

As described above, according to the present embodiment, the double Schottky diode 400 having a low and stable forward voltage is realized by similar functions to the first embodiment. Furthermore, the double Schottky diode 400 reduces a leak current without reducing an on-current excessively when a reverse bias is applied.

Eighth Embodiment

A semiconductor device according to the present embodiment is similar to the seventh embodiment except that a conductive layer contains at least one metal element selected from the group consisting of calcium (Ca), strontium (Sr), and barium (Ba) and that an element which may be contained in the conductive layer is different. Therefore, description of contents overlapping with the seventh embodiment will be omitted. Description of contents overlapping with the first or second embodiment in a structure of the conductive layer, functions, or the like will be omitted.

Figure 9:
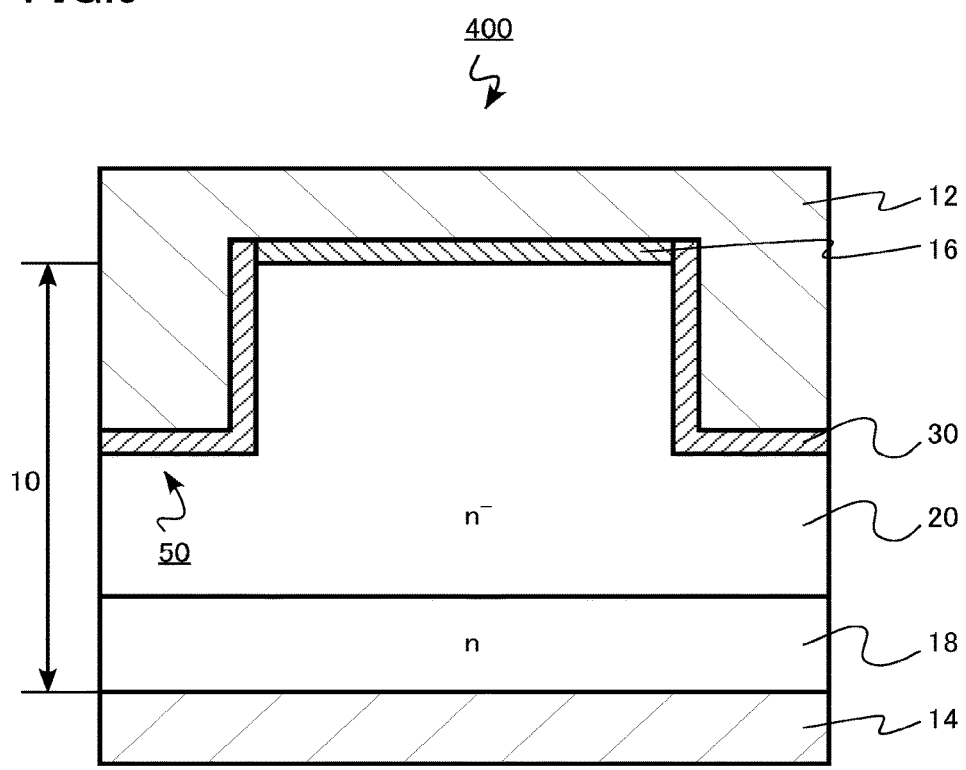
FIG. 9 is a schematic cross sectional view of a semiconductor device according to a seventh embodiment.

The semiconductor device according to the present embodiment is a double Schottky diode. The double Schottky diode according to the present embodiment will be described with reference to FIG. 9.

A conductive layer 16 contains at least one metal element selected from the group consisting of calcium (Ca), strontium (Sr), and barium (Ba). The conductive layer 16 contains titanium (Ti) and oxygen (O). The conductive layer 16 contains at least one element selected from the group consisting of vanadium (V), niobium (Nb), tantalum (Ta), scandium (Sc), yttrium (Y), and lanthanoid.

The conductive layer 16 is formed of a metal oxide. For example, the conductive layer 16 is formed of calcium titanate, strontium titanate, barium titanate, or a complex thereof. For example, the conductive layer 16 is formed of $(Ca,Sr,Ba)TiO_3$ having a perovskite structure. The conductive layer 16 is polycrystalline or amorphous.

The conductive layer 16 is a PTCR. The conductive layer 16 preferably contains lead (Pb). Calcium titanate, strontium titanate, barium titanate, or a complex thereof can shift a positive temperature coefficient region to a higher temperature side by containing lead (Pb).

As described above, according to the present embodiment, the double Schottky diode having a low and stable forward voltage is realized by similar functions to the seventh embodiment. By similar functions to the seventh embodiment, a leak current is reduced without reducing an on-current excessively when a reverse bias is applied. Furthermore, the conductive layer 16 which is a PTCR suppresses breakdown of the double Schottky diode by an overcurrent.

In the first to eighth embodiments, nitrogen (N) has been exemplified as n-type impurities. However, phosphorus (P), arsenic (As), antimony (Sb), or the like can be applied in place of nitrogen (N). Aluminum (Al) has been exemplified as p-type impurities. However, boron (B), gallium (Ga), indium (In), or the like can be applied in place of aluminum (Al).

While certain embodiments have been described, these embodiments have been presented by way of example only, and are not intended to limit the scope of the inventions. Indeed, a semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
   a first metal layer;
   a second metal layer;
   an n-type first SiC region provided between the first metal layer and the second metal layer, the n-type first SiC region having an n-type impurity concentration of $1\times10^{18}$ $cm^{-3}$ or less; and
   a conductive layer provided between the first SiC region and the first metal layer, the conductive layer being in contact with the n-type first SiC region, the conductive layer including titanium (Ti), oxygen (O), and at least one element selected from the group consisting of vanadium (V), niobium (Nb), and tantalum (Ta).

2. The device according to claim 1, wherein the conductive layer further includes nitrogen (N).

3. The device according to claim 1, wherein the conductive layer further includes at least one of zirconium (Zr) and hafnium (Hf).

4. The device according to claim 1, wherein the concentration of the element in the conductive layer is $1\times10^{19}$ $cm^{-3}$ or more.

5. The device according to claim 1, wherein the conductive layer includes titanium oxide.

6. The device according to claim 1, further comprising an n-type second SiC region provided between the first SiC region and the second metal layer, the second SiC region having a higher n-type impurity concentration than the first SiC region.

7. A semiconductor device comprising:
   a first metal layer;
   a second metal layer;
   an n-type first SiC region provided between the first metal layer and the second metal layer, the first SiC region having an n-type impurity concentration of $1\times10^{18}$ $cm^{-3}$ or less; and
   a conductive layer provided between the first SiC region and the first metal layer, the conductive layer being in contact with the first metal layer, the conductive layer being in contact with the n-type first SiC region, the conductive layer including titanium (Ti), oxygen (O), at least one metal element selected from the group consisting of calcium (Ca), strontium (Sr), and barium (Ba), and at least one element selected from the group consisting of vanadium (V), niobium (Nb), tantalum (Ta), scandium (Sc), yttrium (Y), and lanthanoid.

8. The device according to claim 7, wherein the conductive layer further includes nitrogen (N).

9. The device according to claim 7, wherein the conductive layer further includes one of zirconium (Zr) and hafnium (Hf).

10. The device according to claim 7, wherein the concentration of the at least one element in the conductive layer is $1 \times 10^{19}$ cm$^{-3}$ or more.

11. The device according to claim 7, wherein the conductive layer includes calcium titanate, strontium titanate, or barium titanate.

12. The device according to claim 7, wherein the conductive layer includes lead (Pb).

13. The device according to claim 7, wherein a temperature dependency of electric resistance of the conductive layer is changed from negative dependency to positive dependency at a temperature of 150° C. or higher and 200° C. or lower.

14. The device according to claim 7, further comprising an n-type second SiC region provided between the first SiC region and the second metal layer, the second SiC region having a higher n-type impurity concentration than the first SiC region.

* * * * *